(12) United States Patent
Wang et al.

(10) Patent No.: US 6,235,612 B1
(45) Date of Patent: *May 22, 2001

(54) EDGE BOND PADS ON INTEGRATED CIRCUITS

(75) Inventors: Hang Tai Wang; Chao Sien Fong, both of Taipei Hsien; Ching Shou Hsu, Taipei; Cheng Yen Tseng, Tein, all of (TW)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/324,943

(22) Filed: Jun. 3, 1999

Related U.S. Application Data
(60) Provisional application No. 60/088,763, filed on Jun. 10, 1998.

(51) Int. Cl.[7] .......................... H01L 21/301; H01L 21/30; H01L 21/46; H01L 21/44

(52) U.S. Cl. .......................... 438/460; 438/456; 438/458; 438/113; 438/613; 438/614

(58) Field of Search .............................. 438/15, 460, 462, 438/456, 458, 612, 613, 614, 617, 618, FOR 435, 113

(56) References Cited

U.S. PATENT DOCUMENTS

| 4,259,682 | * | 3/1981 | Gamo ................................... 257/620 |
| 5,126,286 | * | 6/1992 | Chance et al. ....................... 438/462 |
| 5,504,369 | * | 4/1996 | Dasse et al. ......................... 257/620 |
| 5,759,753 | * | 6/1998 | Namba et al. ....................... 438/456 |
| 5,880,011 | * | 3/1999 | Zablotny et al. .................... 438/462 |
| 5,904,546 | * | 5/1999 | Wood et al. ......................... 438/460 |
| 6,017,776 | * | 1/2000 | Jiang et al. .......................... 438/118 |
| 6,040,235 | * | 3/2000 | Badehi ................................. 438/464 |
| 6,040,702 | * | 3/2000 | Hembree et al. .................... 324/755 |
| 6,076,256 | * | 6/2000 | Drake et al. ............................. 29/85 |

* cited by examiner

Primary Examiner—Charles Bowers
Assistant Examiner—Brook Kebede
(74) Attorney, Agent, or Firm—Jacqueline J. Garner; Wade James Brady, III; Frederick J. Telecky, Jr.

(57) ABSTRACT

The invention is to a device and the method of making circuit devices with side wall contacts produced on a semiconductor wafer (30) by forming grooves (33,34) partially through the wafer surface to provide a plurality of device elements (32) on a common base (31). After the groves are made in the semiconductor wafer, each device element has a top surface (36) and side surfaces (35a–35d). A semiconductor device or integrated circuit is then formed (32) in the top and side surfaces by well know techniques, including diffusing and deposition processes, to form a semiconductor device. Contact pads are formed on both the top and sides of the device to provide a greater density of contacts for the semiconductor device. The semiconductor devices are separated along the grooves (33,34) to provide individual devices.

15 Claims, 5 Drawing Sheets

EDGE BOND PADS ON INTEGRATED CIRCUITS

This application claims priority under 35 USC §119(e)(1) of provisional application Ser. No. 60/088,763 filed Jun. 10, 1998.

FIELD OF THE INVENTION

The invention relates to integrated circuit devices, and more particularly to integrated circuits having top and edge bonding pads.

BACKGROUND OF THE INVENTION

With the increasing density of components in integrated circuits, it is becoming more difficult to provide the necessary leads and contacts to the integrated circuit device. The larger number of bond pads requires more leads on the lead frame.

One approach to providing a high density bond pad layout is disclosed in U.S. Pat. No. 5,635,424, in which composite bond pad structure and geometry allows an increase in bond pad density. The bond pad density is increased by laying out certain non-square bond pads which are shaped, sized and oriented such that each bond pad closely conforms to the shape of the contact footprint made therewith by a bond wire or lead frame lead.

Another approach used in interconnecting a stack of integrated circuits is to provide a metal edge contact that is connected to surface areas by connecting conductors. This approach is disclosed in U.S. Pat. No. 5,107,586.

SUMMARY OF THE INVENTION

The invention is to a device and the method of making circuit devices with side wall contacts produced on a semiconductor wafer by forming grooves partially through the wafer surface to provide a plurality of device elements on a common base. After the groves are made in the semiconductor wafer, each device element has a top surface and sides surfaces. A semiconductor device or integrated circuit is then formed in the top and side surfaces by well known techniques, including diffusing and deposition processes, to form a semiconductor device. Contact pads are formed on both the top and sides of the device to provide a greater density of contacts for the semiconductor device. The semiconductor devices are separated along the grooves to provide individual devices.

The invention is also to the individual device in which contact pads are on both the top side of the device and the sides of the device.

DESCRIPTION OF A PREFERRED EMBODIMENT

Figure 1:
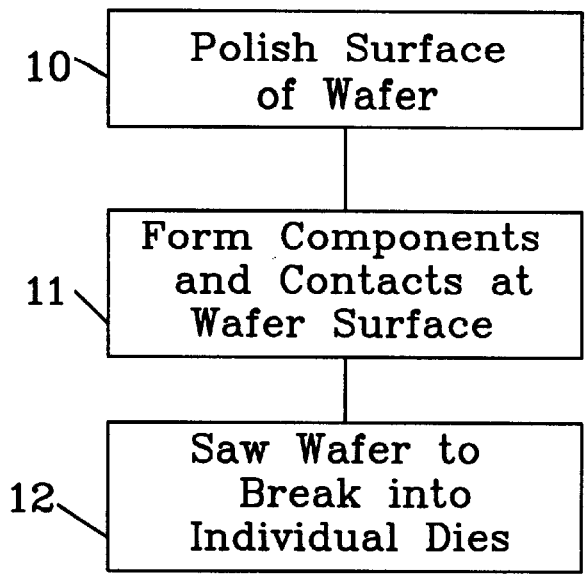
FIG. 1 shows an example of a prior art process for producing the individual die component of an integrated circuit.

In the process of manufacturing integrated circuits and other semiconductor devices, the prior art process shown in FIG. 1, a thin wafer of semiconductor material is polished (10) to provide smooth surfaces on each surface of the semiconductor wafer. Next components, interconnections and contacts are formed (11) in or on one of the wafer surfaces. These elements are formed by diffusion and deposition processes that are well known. Multiple devices are formed on the wafer. After the various components have been formed in and on the wafer, the wafer is cut (12) into elements generally referred to as semiconductor die, a die being a single device. The "cutting" process may be formed by sawing, or by scoring lines to separate the die and then breaking the wafer along the scored lines to separate the wafer into individual die.

Figure 2:
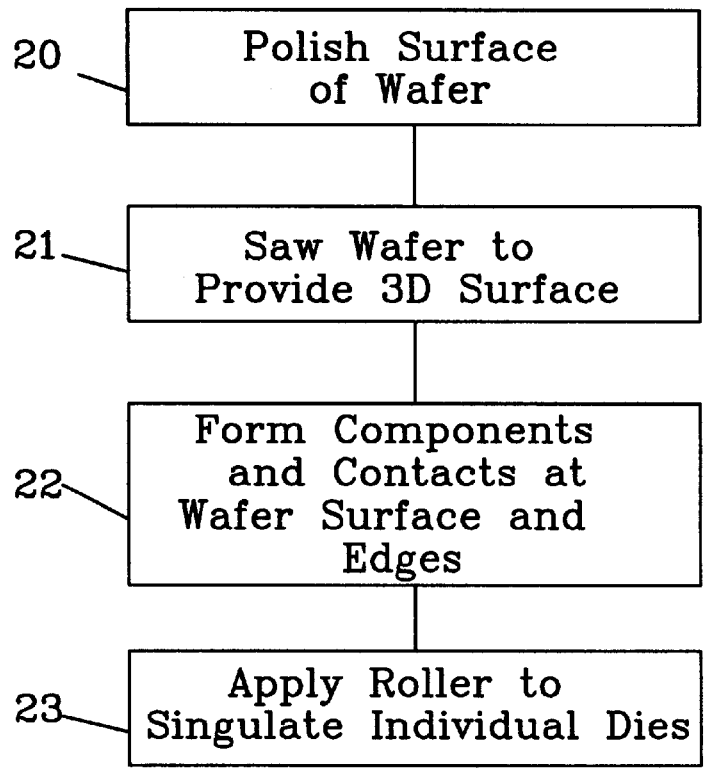
FIG. 2 shows the process for producing 3D surface integrated circuits.

FIG. 2 shows a basic process flow diagram of the present invention. As in the prior art process of FIG. 1, a semiconductor wafer is prepared by polishing its flat surfaces (20). The process of forming a plurality of individual devices (22) is preceded by partially cutting or sawing (21) into the surface of the polished wafer to define the individual semiconductor die and to expose a three dimensional surface. The wafer is cut to a depth to allow edge processes, and to allow the wafer to remain a single entity until device separation is desired. The depth cut around each device may be in the range of 25% to 75% of the wafer thickness, but this is not a limiting range as shallower or deeper cuts may be used in some processes. In the prior art process, only the top surface of a die, or the wafer is exposed to the various diffusion and deposition processes. In the process of FIG. 2, the edges of each individual die are also exposed as a result of the sawing or cutting in the surface of the wafer. This permits diffusions and depositions to be made into both the top and edges of each die by well known processes.

After the various process steps have been performed (22) and each individual die is complete, the wafer is then separated into the individual die by, for example, rolling the wafer with a roller.

Figure 3:
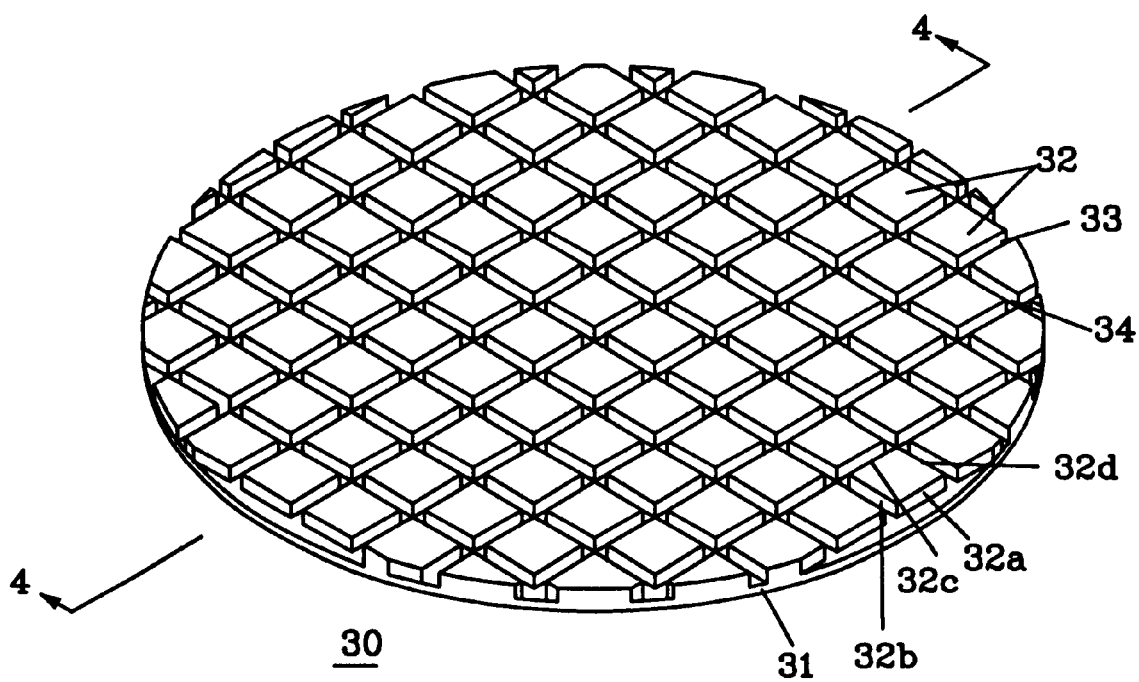
FIG. 3 shows a semiconductor wafer according to the present invention.

FIG. 3 shows a wafer 30 that has been sawed to provide grooves 33 and 34, at 90 degree angles to each other, for separating the wafer 30 into a plurality of individual die 32. Each die 32 has four edges 32a–32d exposed as a result of the grooves 33 and 34. The base portion 31 of wafer 30 has not been cut through by grooves 33 and 34, holding the individual die 32 together.

Figure 4:
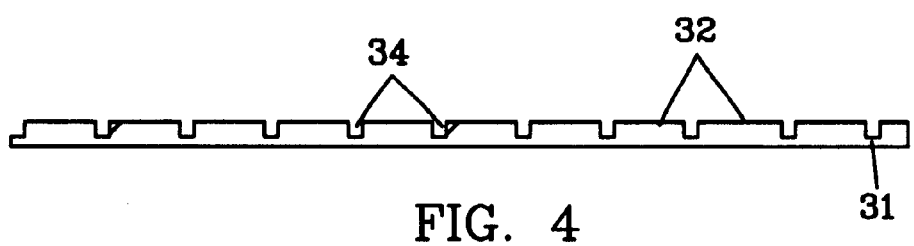
FIG. 4 is a cross-section view of the wafer of FIG. 3.

FIG. 4 is a cross-sectional view, taken through section 4—4 of FIG. 3. Grooves 34 are shown separating the die 32. Base 31 is shown under, and forms a part of each die 32.

Figure 5:
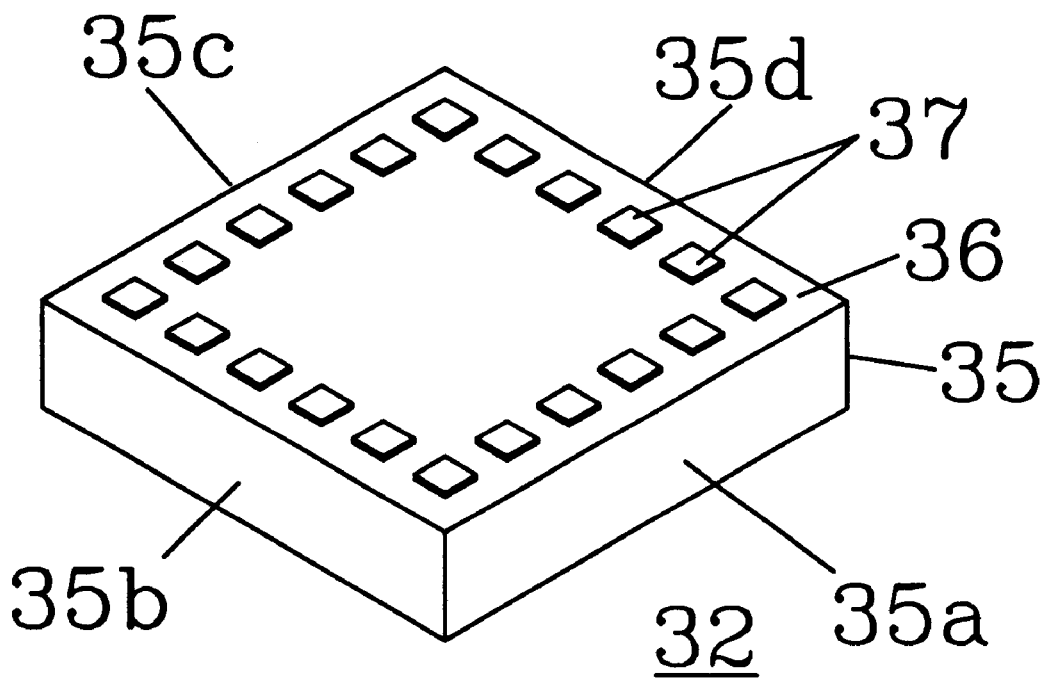
FIG. 5 shows a prior art integrated die with top surface bond pads.

FIG. 5 shows a prior art device 32 with die 35 having contact pads 37 on the top surface 36. There are no contact pads on any of the sides 35a–35d.

Figure 6:
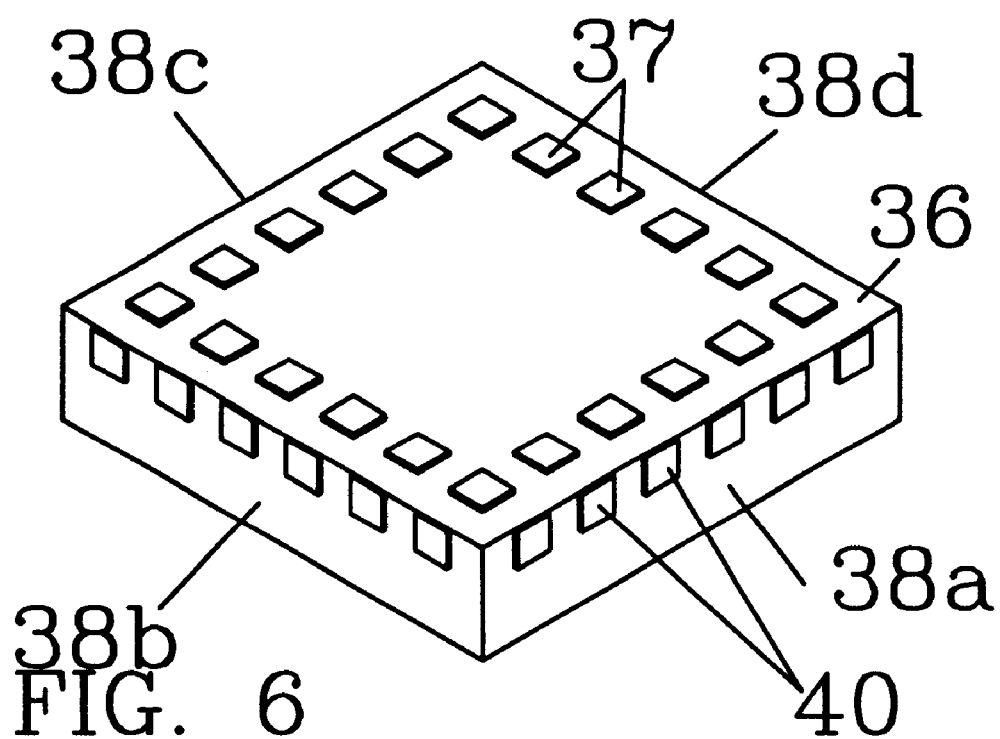
FIG. 6 shows an integrated circuit die according to the present invention.
Figure 7:
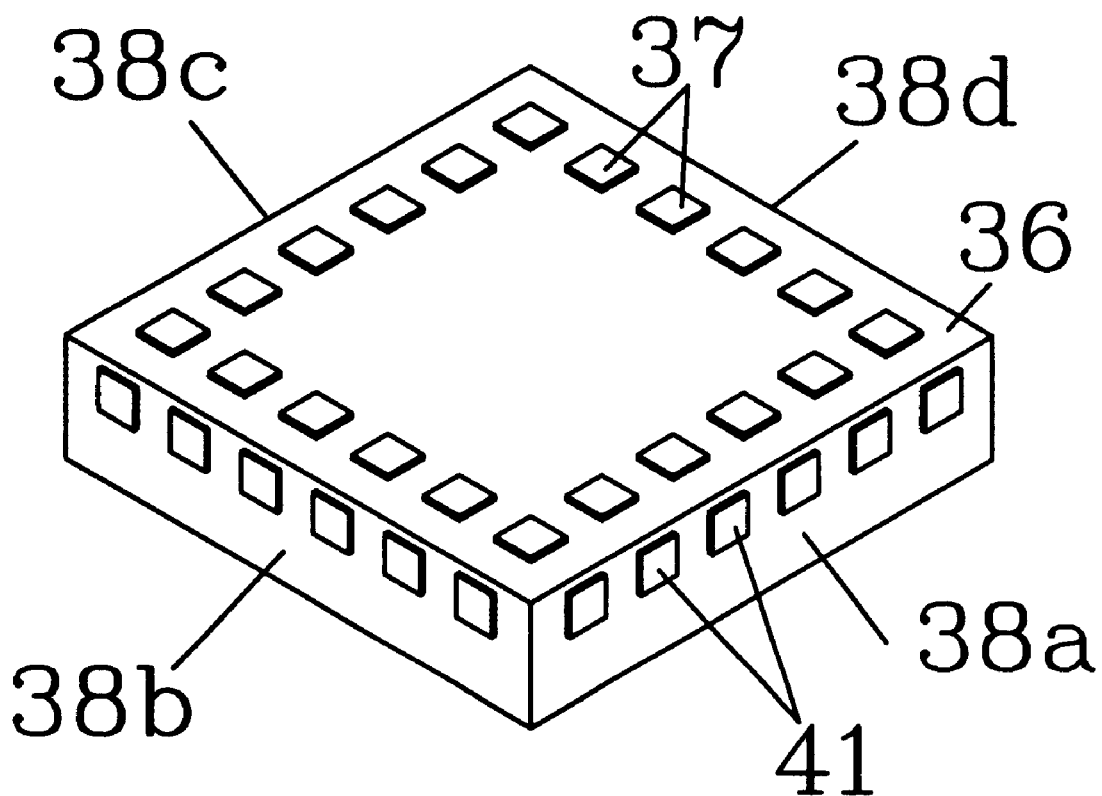
FIG. 7 shows a second integrated circuit die according to the invention.

FIG. 6 shows an example of a separated die 32 after circuit elements have been formed thereon and contact pads deposited onto a contact areas. Contact pads 37 have been formed on the top surface 36 of each die 32 and a plurality of contact pads 40 have been formed on the sides of die 32. In the example of FIG. 6, contact pads 40 have been formed with the upper edge of each contact 40 extending to the top of the side, for example sides 38a–38d. The contact pads 40 may all be placed in a common position on the side of die 32 with the edge extending to the top surface as shown in FIG. 6, or the contact pad may be positioned below the top edge of sides 38a–38d, for example, as contact pads 41 illustrated in FIG. 7. The contact pads 40 and 41 may be at various positions as needed by the specific circuit connections on the device 32. Both circuit elements and interconnecting wiring on device 32 may be on the top surface 36 or the sides 38a–38d as required by the device configuration.

What is claimed is:

1. A method of making circuit devices with side wall contacts comprising the steps of providing a semiconductor wafer having a pair of opposing major surfaces;

polishing one of said major surfaces;

forming grooves partially through said wafer from said one of said major wafer surfaces entirely in a direction normal to said one of said major surfaces to provide a plurality of device elements on a common base, each device element having a top surface which is said one of said major surfaces, a bottom surface, and side surfaces extending from said top surface toward said bottom surface;

then forming circuit components, interconnections and bond pads on the top and bond pads at least one of said side surfaces of each device element said bond pads disposed on said at least one of said side surfaces entirely disposed in said groove, to produce a plurality of circuit devices; and then singulating the circuit devices by separating the common base along the grooves and partially through the wafer surface so that said side surfaces are planar and extend from said top surface to said bottom surface in a direction normal to said top surface.

2. The method according to claim 1, wherein the bond pads on said at least one of said side surfaces extend to the top surface of the device element.

3. The method according to claim 1, wherein the bond pads on said at least one of said side surfaces are positioned below the top surface of the device element.

4. The method according to claim 1, wherein the circuit devices are singulated by applying a roller over the wafer.

5. The method according to claim 1, wherein the grooves are formed in the wafer by sawing.

6. The method according to claim 1, wherein each device element has four side surfaces and said step of forming circuit components, interconnections and bond pads forms circuit components, interconnections and bond pads on said top surface and bond pads on said four side surfaces.

7. A method of making circuit devices with side wall contacts comprising the steps of:

providing a semiconductor wafer having a pair of opposing major surfaces;

forming grooves entirely in a direction normal to one of said opposing major surfaces partially through said wafer from said one of said pair of opposing major surfaces of said semiconductor wafer to provide a plurality of circuit devices on a common base, each circuit device having a top surface which is said one of said pair of opposing major surfaces, a bottom surface, and side surfaces extending from said top surface toward said bottom surface;

then forming bond pads on the top and at least one of said side surfaces of each circuit device to produce a plurality of circuit devices; and then singulating the circuit devices by separating the comon base along the grooves so that said side surfaces are planar and extend from said top surface to said bottom surface entirely in a direction normal to said top surface.

8. The method of claim 7, further comprising the step of forming circuit components in said top surface and said at least one of said side surfaces.

9. The method of claim 7, wherein each circuit device has four side surfaces.

10. The method of claim 1 further wherein said step of forming circuit components further includes the step of forming circuit components and interconnections on said at least one of said side surfaces.

11. The method of claim 2 further wherein said step of forming circuit components further includes the step of forming circuit components and interconnections on said at least one of said side surfaces.

12. The method of claim 3 further wherein said step of forming circuit components further includes the step of forming circuit components and interconnections on said at least one of said side surfaces.

13. The method of claim 4 further wherein said step of forming circuit components further includes the step of forming circuit components and interconnections on said at least one of said side surfaces.

14. The method of claim 5 further wherein said step of forming circuit components further includes the step of forming circuit components and interconnections on said at least one of said side surfaces.

15. The method of claim 6 further wherein said step of forming circuit components further includes the step of forming circuit components and interconnections on said at least one of said side surfaces.

* * * * *